US012748169B2

(12) United States Patent
Liu et al.

(10) Patent No.: US 12,748,169 B2
(45) **Date of Patent: *Sep. 29, 2026**

(54) SHIMMING DEVICE FOR A MAGNETIC RESONANCE IMAGING SYSTEM

(71) Applicant: SHANGHAI UNITED IMAGING HEALTHCARE CO., LTD., Shanghai (CN)

(72) Inventors: Shuguang Liu, Shanghai (CN); Man Fan, Shanghai (CN); Jiwen Yang, Shanghai (CN); Yuan Gao, Shanghai (CN); Lifeng Wang, Shanghai (CN); Tao Wang, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 350 days.

This patent is subject to a terminal disclaimer.

(21) Appl. No.: 18/333,505

(22) Filed: Jun. 12, 2023

(65) Prior Publication Data

US 2023/0324484 A1 Oct. 12, 2023

Related U.S. Application Data

(63) Continuation of application No. 17/305,331, filed on Jul. 5, 2021, now Pat. No. 11,675,036.

(30) Foreign Application Priority Data

Mar. 17, 2021 (CN) ......................... 202110285132.3
Mar. 17, 2021 (CN) ......................... 202120547987.4

(51) Int. Cl.

| | |
|---|---|
| ***G01R 33/3875*** | (2006.01) |
| ***G01R 33/34*** | (2006.01) |
| ***G01R 33/421*** | (2006.01) |

(52) U.S. Cl.

CPC .................... *G01R 33/3875* (2013.01); *G01R 33/34023* (2013.01); *G01R 33/4215* (2013.01)

(58) Field of Classification Search

CPC .......... G01R 33/3875; G01R 33/34023; G01R 33/4215

See application file for complete search history.

(56) References Cited

U.S. PATENT DOCUMENTS 4,633,179 A 12/1986 Sugimoto
5,409,558 A 4/1995 Takahasi et al.
(Continued)

FOREIGN PATENT DOCUMENTS

CN 102290188 B 1/2013
CN 103065758 A 4/2013
(Continued)

OTHER PUBLICATIONS

Hu, Geli et al., Shim Coil Set for NMR Using a Novel Target Field Method Based on Trigonometric Series, IEEE Transactions on Applied Superconductivity, 24(3), 2014, 5 pages.

*Primary Examiner* — Daniel R Miller
(74) *Attorney, Agent, or Firm* — METIS IP LLC

(57) ABSTRACT

The present disclosure relates to a shimming device. The shimming device may include at least one supporting component each of which is configured with a plurality of wire groove groups. Each of the plurality of wire groove groups may include a plurality of wire grooves. Each of the plurality of wire grooves may be in a closed shape. The closed shapes formed by the plurality of wire grooves may be nested. The shimming device may further include wires arranged in the wire grooves of the plurality of wire groove groups of the at least one supporting component.

19 Claims, 10 Drawing Sheets

(56) References Cited

U.S. PATENT DOCUMENTS

| | | | |
|---|---|---|---|
| 6,342,787 | B1 | 1/2002 | Petropoulos et al. |
| 2005/0285597 | A1 | 12/2005 | Maki et al. |
| 2008/0079529 | A1 | 4/2008 | Schmidt |
| 2008/0246480 | A1 | 10/2008 | Kawamoto |
| 2009/0051241 | A1 | 2/2009 | Wiezoreck |
| 2012/0098541 | A1 | 4/2012 | Konijn et al. |
| 2013/0154648 | A1 * | 6/2013 | Shen ................ G01R 33/56518 324/322 |
| 2013/0184158 | A1 | 7/2013 | Wang et al. |
| 2015/0318102 | A1 | 11/2015 | Meinke et al. |
| 2016/0054407 | A1 | 2/2016 | Parizh et al. |

FOREIGN PATENT DOCUMENTS

| | | | |
|---|---|---|---|
| CN | 103093953 | A * | 5/2013 |
| CN | 204834234 | U | 12/2015 |
| CN | 103515048 | B | 3/2016 |
| CN | 109765510 | A | 5/2019 |
| CN | 112444766 | A | 3/2021 |
| EP | 0210289 | A1 * | 2/1987 |
| JP | H042329 | A | 1/1992 |
| JP | 2014217564 | A | 11/2014 |
| WO | 2008122899 | A1 | 10/2008 |

* cited by examiner

SHIMMING DEVICE FOR A MAGNETIC RESONANCE IMAGING SYSTEM

CROSS-REFERENCE TO RELATED APPLICATIONS

This application is a continuation of U.S. application Ser. No. 17/305,331, filed on Jul. 5, 2021, which claims priority to Chinese Patent Application Nos. 202110285132.3 and 202120547987.4, both filed on Mar. 17, 2021, the contents of each of which are hereby incorporated by reference.

TECHNICAL FIELD

The present disclosure generally relates to a medical imaging system, and more particularly, relates to shimming device for a magnetic resonance imaging (MRI) system.

BACKGROUND

MRI systems are often used to diagnose pathology and internal injuries. A typical MRI system may include a main magnet configured to generate a main magnetic field in an imaging area. The uniformity of the main magnetic field provides an indicator to measure the performance of the MRI system. Therefore, the MRI system may further include a shimming device configured to improve the uniformity of the main magnetic field generated by the main magnet.

SUMMARY

An aspect of the present disclosure relates to a shimming device. The shimming device may include at least one supporting component each of which is configured with a plurality of wire groove groups. Each of the plurality of wire groove groups may include a plurality of wire grooves. Each of the plurality of wire grooves may be in a closed shape. The closed shapes formed by the plurality of wire grooves may be nested. The shimming device may further include wires arranged in the wire grooves of the plurality of wire groove groups of the at least one supporting component.

In some embodiments, the each of the plurality of wire grooves may include an outlet. The outlet may be configured to extend wire arranged in the wire groove to outside the shimming device or another wire groove of the plurality of wire grooves.

In some embodiments, the shimming device may further include an electrically insulating element that is arranged on an inner wall of the each of the plurality of wire grooves.

In some embodiments, the shimming device may further include a first fixing component configured to fix the wires in the wire grooves of the plurality of wire groove groups.

In some embodiments, the shimming device may further include a second fixing component configured to fix a second supporting component of the at least one supporting component on a periphery of a first supporting component of the at least one supporting component.

In some embodiments, the each of the plurality of wire groove groups may be in a saddle shape.

In some embodiments, each of the wires may include a wire harness of multiple wires.

A further aspect of the present disclosure relates to a method for manufacturing a shimming device. The method may include providing at least one supporting component and determining a plurality of wire groove groups on each of the at least one supporting component. Each of the plurality of wire groove groups may include a plurality of wire grooves. The method may further include processing the wire grooves of the plurality of wire groove groups on the at least one supporting component and arranging wires in the wire grooves of the plurality of wire groove groups on the at least one supporting component.

In some embodiments, the determining a plurality of wire groove groups on each of the at least one supporting component may include, for the each of the plurality of wire groove groups, determining, based on a main magnetic field, a distribution of the plurality of wire grooves of the wire groove group on the each of the at least one supporting component.

In some embodiments, the determining, based on a main magnetic field, a distribution of the plurality of wire grooves of the wire groove group on the each of the at least one supporting component may include, on the each of the at least one supporting component, determining a distribution of a current density on the supporting component based on the main magnetic field and determining the distribution of the plurality of wire grooves on the supporting component based on the distribution of the current density.

In some embodiments, the arranging wires in the wire grooves of the plurality of wire groove groups may include winding at least one wire in the wire grooves of the plurality of wire groove groups.

In some embodiments, the processing the wire grooves of the plurality of wire groove groups on the at least one supporting component may include processing, by five-axis linkage computer numerical control (CNC) machining, the wire grooves of the plurality of wire groove groups on the at least one supporting component.

In some embodiments, the each of the plurality of wire groove groups may be in a saddle shape.

A still further aspect of the present disclosure relates to a magnetic resonance imaging (MRI) system. The MRI system may include a cryostat, a main magnet, a shielding coil assembly, and a shimming device. The main magnet may be arranged in the cryostat and configured to generate a main magnetic field. The shielding coil assembly may be arranged in the cryostat and configured to shield the main magnetic field from leaking to an exterior of the MRI system. The shimming device may be arranged in the cryostat and configured to improve uniformity of the main magnetic field. The shimming device may be arranged between the main magnet and the shielding coil assembly.

In some embodiments, the main magnet may include a plurality of main coils and a main skeleton for supporting the plurality of main coils. The shimming device may be arranged on a side of the main magnet facing the shielding coil assembly and include a plurality of coils. Each of the plurality of coils may be of a saddle shape.

In some embodiments, the shielding coil assembly may include a plurality of shielding coils and a shielding skeleton for supporting the plurality of shielding coils. A radial dimension of the shielding skeleton may be larger than a radial dimension of the main skeleton.

In some embodiments, the shimming device may include at least one supporting component each of which is configured with a plurality of wire groove groups. Each of the plurality of wire groove groups may include multiple wire grooves. The plurality of coils may be arranged in the multiple wire grooves of the plurality of wire groove groups of the at least one supporting component. The at least one supporting component may be arranged between the main skeleton and the shielding skeleton.

In some embodiments, the at least one supporting component may be sleeved outside the main magnet. The plurality of wire groove groups may include at least one first wire groove group and at least one second wire groove group. The at least one first wire groove group and at least one second wire groove group may be arranged symmetrically or approximately symmetrically with respect to an axial direction of the main magnet.

In some embodiments, the at least one supporting component may be arranged on an outer circumference of the main magnet.

In some embodiments, each of the plurality of wire grooves may be of a closed shape that is formed by the plurality of wire grooves being nested.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

Figure 1:
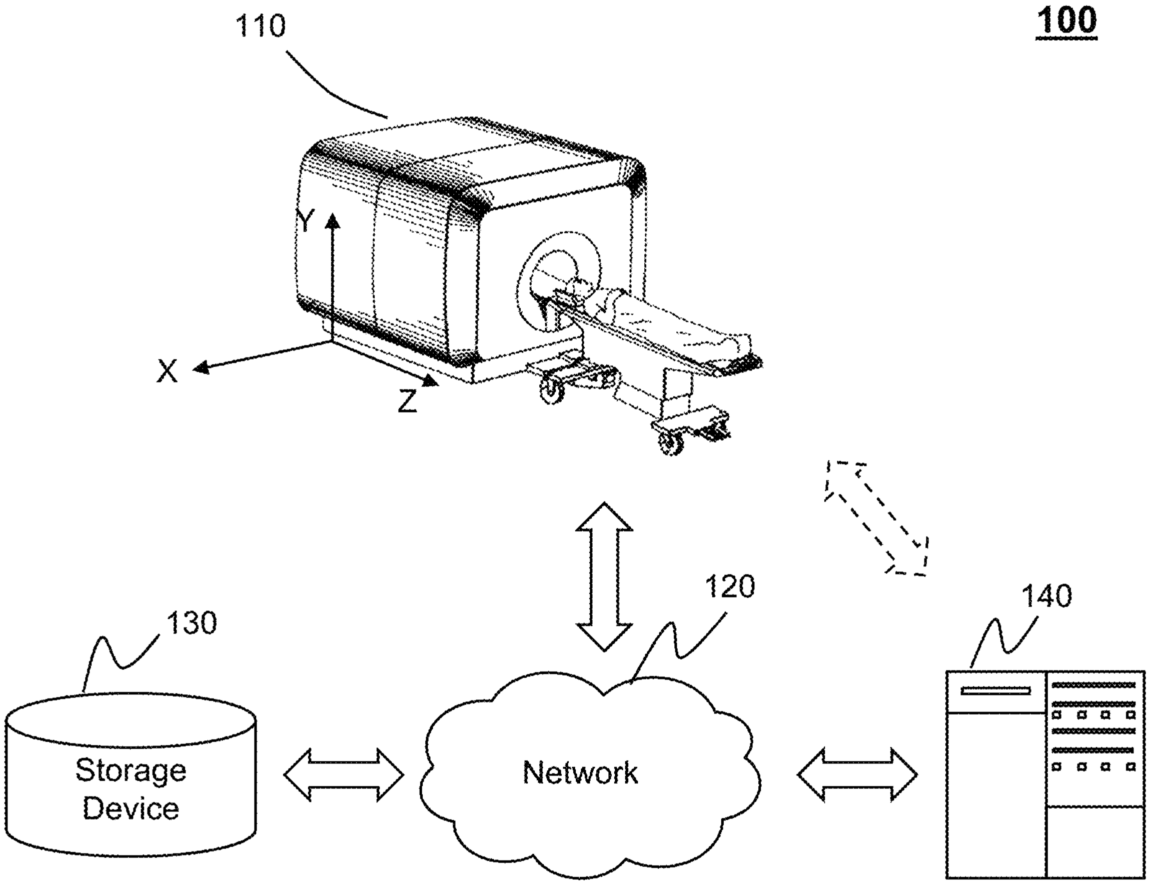
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, sections, or assembly of different levels in ascending order. However, the terms may be displaced by another expression if they achieve the same purpose.

In addition, it should be understood that in the description of the present disclosure, the terms "first", "second", or the like, are only used for the purpose of differentiation, and cannot be interpreted as indicating or implying relative importance, nor can be understood as indicating or implying the order.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The following descriptions are provided with reference to an MRI system in a superconducting state. The MRI system may be used for non-invasive imaging, which may be used for disease diagnosis, disease treatment, or research purposes. In some embodiments, the MRI system may include one or more modalities including a Magnetic Resonance Angiography (MRA) system, CT (computed tomography)-MRI system, DSA (digital subtraction angiography)-MRI system, PET (positron emission tomography)-MRI system, TMS (transcranial magnetic stimulation)-MRI system, US (ultrasound scanning)-MRI system, X-ray-MRI system, or the like, or any combination thereof.

Conventionally, a shimming device (or referred to as a shimming coil) of an MRI system is manufactured by first winding wires on a flat carrier, bending the flat carrier into a specific shape, and then fixing the bent carrier with the wires onto a supporting component, which is complicated and has low accuracy.

An aspect of the present disclosure relates to a shimming device. The shimming device may include at least one supporting component. Each of the at least one supporting component may be configured with a plurality of wire groove groups. Each of the plurality of wire groove groups may include a plurality of wire grooves. Each of the plurality of wire grooves may be in a closed shape. The closed shapes formed by the plurality of wire grooves may be nested. The shimming device may further include wires arranged (or wound) in the wire grooves of the plurality of wire groove groups of the at least one supporting component. Compared with the conventional shimming device, in the shimming device according to some embodiments of the present disclosure, the plurality of wire groove groups may be directly arranged on the supporting component and the wires may be arranged in wire grooves of the plurality of wire groove groups, thereby simplifying a manufacturing process and reducing the manufacturing cost of the shimming device, and improving the firmness of the wires on the supporting component.

Another aspect of the present disclosure relates to a magnetic resonance imaging (MRI) system. The MRI system may include a cryostat and a magnet assembly arranged in the cryostat. The magnet assembly may include a main magnet, a shielding coil assembly, and a shimming device (e.g., the shimming device mentioned above). The main magnet may be configured to generate a main magnetic field. The shielding coil assembly may be configured to shield the main magnetic field from leaking to an exterior of the MRI system. The shimming device may be configured to improve uniformity of the main magnetic field. Conventionally, the shimming device may be arranged in the bore formed by the cryostat (i.e., the shimming device being arranged outside the cryostat), which may result in a reduction in the space available in the bore where an object is being placed for imaging; in order to provide enough space in the bore for accommodating the object, the magnet assembly including the main magnet may need to be configured to form a larger bore and therefore farther away from the object than without the shimming device in the bore. Accordingly, such an arrangement of placing the shimming device outside the cryostat may cause issues including, e.g., a need for a stronger main magnet. In some embodiments of the present disclosure, the shimming device may be arranged between the main magnet and the shielding coil assembly (i.e., the shimming device being arranged in the cryostat). Compared with the conventional arrangement of the shimming device as described in which the shimming device is arranged outside the cryostat, the arrangement of the shimming device according to some embodiments of the present disclosure may avoid the issues caused by having the shimming device occupy space in the bore of the cryostat.

FIG. 1 is a schematic diagram illustrating an exemplary MRI system according to some embodiments of the present disclosure. As illustrated in FIG. 1, the MRI system 100 may include an MR apparatus 110, a network 120, a storage device 130, and a processing device 140. The components (e.g., the MR apparatus 110, the network 120, the storage device 130, and the processing device 140) of the MRI system 100 may be connected in one or more of various ways. Mere by way of example, as illustrated in FIG. 1, the MR apparatus 110 may be connected to the processing device 140 via the network 120. As another example, the MR apparatus 110 may be connected to the processing device 140 directly (as indicated by the bi-directional arrow in dotted lines linking the MR apparatus 110 and the processing device 140).

The MR apparatus 110 may scan an object located within its imaging area (or referred to as a detection area) and generate a plurality of data relating to the object. The imaging area of the MR apparatus 110 may be in a scanning bore of the MR apparatus 110. Mere by way of example, the object may include a patient, a man-made object, or the like, or any combination thereof. As another example, the object may include a specific portion, organ, and/or tissue of a patient. As a further example, the object may include a head, a brain, a neck, a body, a shoulder, an arm, a thorax, a heart, a stomach, a blood vessel, a soft tissue, a knee, feet, or the like, or any combination thereof.

In some embodiments, the MR apparatus 110 may be a close-bore MR apparatus or an open-bore MR apparatus. The MR apparatus 110 may include a main magnet, a gradient coil assembly, a radiofrequency (RF) coil assembly, and a shimming device, etc. The main magnet may generate a main magnetic field in the imaging area for polarizing the object to be scanned. The main magnet may include a permanent magnet, a superconducting electromagnet, a resistive electromagnet, etc. In some embodiments, when the main magnet is the superconducting electromagnet, the MR apparatus 110 may be a superconducting MR apparatus. More descriptions regarding the superconducting MR apparatus may be found elsewhere in the present disclosure (e.g., FIG. 2 and the descriptions thereof).

The gradient coil assembly may generate a gradient magnetic field. The gradient coil assembly may generate one or more magnetic field gradient pulses to the main magnetic field in the X direction (Gx), Y direction (Gy), and Z direction (Gz) to encode the spatial information of the object. As illustrated in FIG. 1, the X-axis, the Y-axis, and the Z-axis may form an orthogonal coordinate system. The X-axis and the Z-axis may be horizontal, and the Y-axis may be vertical. As illustrated in FIG. 1, the positive X direction along the X-axis may be from the right side to the left side of the MR apparatus 110 seen from the direction facing the front of the MR apparatus 110; the positive Y direction along the Y-axis may be from the lower part to the upper part of the MR apparatus 110; the positive Z direction along the Z-axis may refer to a direction in which the object is moved out of the scanning bore of the MR apparatus 110. The imaging area may be in the scanning bore. The imaging area may be a portion of the scanning bore.

The RF coil assembly may include a plurality of RF coils. The plurality of RF coils may include one or more RF transmitting coils and/or one or more RF receiving coils. The RF transmitting coil(s) may transmit RF pulses to the object. Under the coordinated action of the main magnetic field, the gradient magnetic field, and the RF pulses, MR signals (e.g., MR analog signals) relating to the object may be generated. The RF receiving coils may receive MR signals from the object.

The shimming device may be configured to improve uniformity of the main magnetic field generated by the main magnet in the imaging area so that the MR apparatus 110 may generate a uniform main magnetic field, which in turn may improve the performance of the MR apparatus 110 and the accuracy of the imaging of the object. The shimming device may include at least one supporting component. Each of the at least one supporting component may be configured with a plurality of wire groove groups. Each of the plurality of wire groove groups may include a plurality of wire grooves. Wires may be arranged (or wound) in the wire grooves of the plurality of wire groove groups of the at least one supporting component. More descriptions regarding the shimming device may be found elsewhere in the present disclosure (e.g., FIGS. 2-4 and the descriptions thereof).

The network 120 may include any suitable network that can facilitate the exchange of information and/or data for the MRI system 100. In some embodiments, one or more components (e.g., the MR apparatus 110, the processing device 140, or the storage device 130) of the MRI system 100 may communicate information and/or data with one or more other components of the MRI system 100 via the network 120.

The processing device 140 may process data and/or information (e.g., MR signals) obtained from the MR apparatus 110 and/or the storage device 130. In some embodiments, the processing device 140 may determine a configuration of a plurality of wire groove groups on each of the at least one supporting component of the shimming device. For example, for each of the plurality of wire groove groups, the processing device 140 may determine a distribution of a plurality of wire grooves of the wire groove group on the each of the at least one supporting component based on the main magnetic field generated by the main magnet in the imaging area. In some embodiments, the processing device 140 may access information and/or data stored in or acquired by the MR apparatus 110 and/or the storage device 130 via the network 120. As another example, the processing device 140 may be directly connected to the MR apparatus 110 (as illustrated by the bidirectional arrow in dashed lines connecting the processing device 140 and the MR apparatus 110 in FIG. 1) and/or the storage device 130 to access stored or acquired information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

The storage device 130 may store data and/or instructions. In some embodiments, the storage device 130 may store data obtained from the MR apparatus 110 and/or the processing device 140. In some embodiments, the storage device 130 may store data and/or instructions that the processing device 140 may execute or use to perform exemplary methods described in the present disclosure. For example, the storage device 130 may store data and/or instructions that the processing device 140 may execute to determine a configuration of the plurality of wire groove groups on the each of the at least one supporting component of the shimming device. In some embodiments, the storage device 130 may include a mass storage device, a removable storage device, a volatile read-and-write memory, a read-only memory (ROM), or the like, or any combination thereof. In some embodiments, the storage device 130 may be implemented on a cloud platform described elsewhere in the present disclosure.

In some embodiments, the storage device 130 may be connected to the network 120 to communicate with one or more components (e.g., the MR apparatus 110, the processing device 140, etc.) of the MRI system 100. One or more components of the MRI system 100 may access the data or instructions stored in the storage device 130 via the network 120. In some embodiments, the storage device 130 may be directly connected to or communicate with one or more components (e.g., the MR apparatus 110, the processing device 140, etc.) of the MRI system 100. In some embodiments, the storage device 130 may be part of the processing device 140.

It should be noted that the MRI system 100 and the MR apparatus 110 illustrated in FIG. 1 are merely provided for the purposes of illustration, and not intended to limit the scope of the present disclosure. For persons having ordinary skills in the art, multiple variations and modifications may be made under the teachings of the present disclosure. For example, the MRI system 100 may further include one or more power supplies connected to one or more components (e.g., the MR apparatus 110, the processing device 140, the storage device 130, etc.) of the MRI system 100. However, those variations and modifications do not depart from the scope of the present disclosure.

Figure 2:
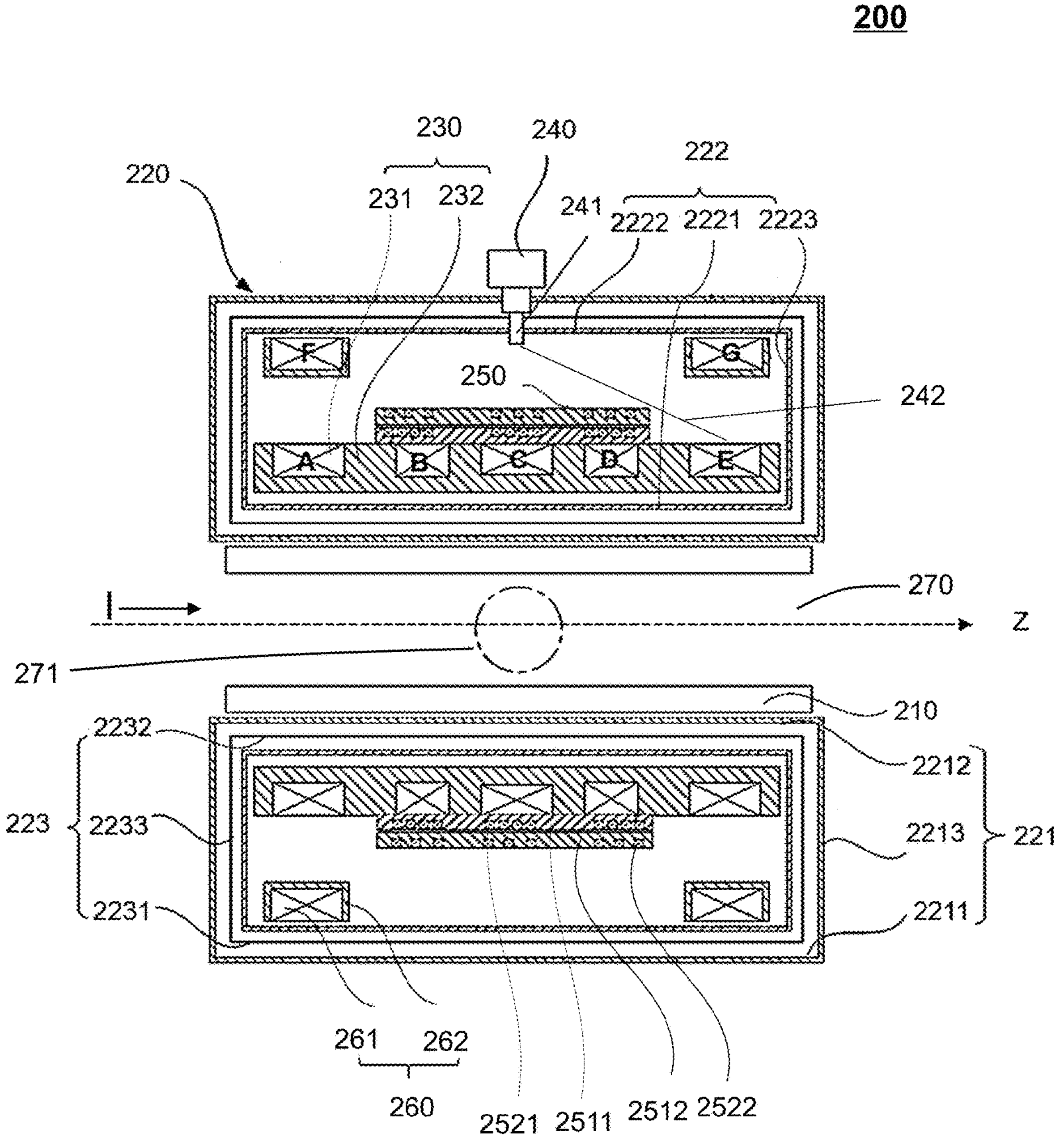
FIG. 2 is a schematic diagram illustrating a cross-sectional view of a superconducting MR apparatus according to some embodiments of the present disclosure.

FIG. 2 is a schematic diagram illustrating a cross-sectional view of a superconducting MR apparatus 200 according to some embodiments of the present disclosure. As shown in FIG. 2, the superconducting MR apparatus 200 may include a gradient coil assembly 210, a radiofrequency (RF) coil assembly (not shown), a cryostat 220, and a magnet assembly (not shown), etc.

The gradient coil assembly 210 may be configured to generate a gradient magnetic field. The gradient coil assembly 210 may be arranged in a bore 270 of the cryostat 220 along an axial direction Z (e.g., the Z-axis described in FIG. 2). A dash-dotted circle 271 in FIG. 2 illustrates the cross-section of the bore 270 viewed from direction I. As illustrated, the bore 270 has a circular cross-section that is perpendicular to the axial direction Z. The RF coil assembly may include a plurality of RF coils. The RF coil assembly may also be arranged in the bore 270 of the cryostat 220. The RF coil assembly may include a plurality of coils (e.g., transmit coils, receiver coils, etc.) for transmitting and/or receiving RF signals. More descriptions regarding the gradient coil assembly 210 and the RF coil assembly may be found elsewhere in the present disclosure (e.g., FIG. 1 and the descriptions thereof).

The cryostat 220 may accommodate other components (e.g., the magnet assembly) of the superconducting MR apparatus 200. In some embodiments, the cryostat 220 may be a multilayer structure including one or more shells. The one or more shells may include an outer container 221, an inner container 222, and/or an intermediate layer 223. In some embodiments, the outer container 221 may be made of a non-magnetic or weakly magnetic material, for example, steel (e.g., carbon steel, stainless steel, etc). More descriptions regarding the non-magnetic and the weakly magnetic material may be found elsewhere in the present disclosure (e.g., FIG. 3A and the descriptions thereof). In some embodiments, the outer container 221 may include a first outer side wall 2211, a first inner side wall 2212, and two first connection side walls 2213 (one first connection side wall 2213 on each of the two ends of the container 221) connecting the first outer side wall 2211 and the first inner side wall 2212. The first outer side wall 2211 and the first inner side wall 2212 may be hollow cylinders. The first connection side walls 2213 may be a ring-shaped structure.

The first outer side wall 2211, the first inner side wall 2212, and the first connection side walls 2213 may form a first cavity. The cross-section of the first cavity may have the shape of a ring. The first cavity may be configured to accommodate one or more other components (e.g., the inner container 222 and the intermediate layer 223 of the cryostat 220, the magnet assembly) of the superconducting MR apparatus 200.

In some embodiments, the inner container 222 may be arranged in the first cavity formed by the outer container 221. The inner container 222 may include a second outer side wall 2221, a second inner side wall 2222, and two second connection side walls 2223 connecting the second outer side wall 2221 and the second inner side wall 2222. The second outer side wall 2221 and the second inner side wall 2222 may be hollow cylinders. The second connection side walls 2223 may be a ring-shaped structure. The second outer side wall 2221, the second inner side wall 2222, and the two second connection side walls 2223 form a second cavity that is used to accommodate one or more other components (e.g., the magnet assembly) of the superconducting MR apparatus 200. In some embodiments, the cryostat 220 may lack the inner container 222.

In some embodiments, the intermediate layer 223 may be arranged between the outer container 221 and the inner container 222. The intermediate layer 223 may include a third outer side wall 2231, a third inner side wall 2232, and two third connection side walls 2233 connecting the third outer side wall 2231 and the third inner side wall 2232. The third outer side wall 2231 and the third inner side wall 2232 may be hollow cylinders. The third connection side walls 2233 may be a ring-shaped structure. The third outer side wall 2231, the third inner side wall 2232, and the two third connection side walls 2233 form a third cavity that is used to accommodate one or more other components (e.g., the magnet assembly, the inner container 222) of the superconducting MR apparatus 200. The third outer side wall 2231 may be located between the first outer side wall 2211 and the second outer side wall 2221. The third inner side wall 2232 may be located between the first inner side wall 2212 and the second inner side wall 2222. Each of the third connection side walls 2233 may be located between a first connection side wall 2213 and a second connection side wall 2223. In some embodiments, the cryostat 220 may lack the intermediate layer 223.

In some embodiments, the magnet assembly may be arranged in the cryostat 220. For example, the magnet assembly may be arranged in the second cavity formed by the inner container 222. The magnet assembly may include a main magnet 230, a shimming device 250, and a shielding coil assembly 260. The main magnet 230 may be configured to generate a main magnetic field for polarizing the object in an imaging area. The main magnet 230 may include a superconducting electromagnet. The superconducting electromagnet may be made of a superconducting material. The cryostat 220 may maintain the main magnet 230 in a superconducting state so that the main magnet 230 may work properly. The superconducting state may refer to the state of a superconducting electromagnet in which the superconducting electromagnet exhibits superconducting properties, such as a zero or essentially zero electrical resistance state.

In some embodiments, the superconducting electromagnet may be in the superconducting state when the temperature of the superconducting electromagnet remains low (e.g., at approximately 4.2 K) by, e.g., exposing or immersing the superconducting electromagnet in a low-temperature ambient. The low temperature of the ambient may be achieved by filling the ambient with a cooling medium. Merely by way of example, the cooling medium may include liquid helium. In order to achieve and maintain the low-temperature ambident, the cryostat 220 may further include a refrigeration component 240 configured to cool the cooling medium. As shown in FIG. 2, the refrigeration component 240 may be arranged in the cryostat 220. The refrigeration component 240 may include a cold head 241. The refrigeration component 240 may cool the cooling medium by heat exchange between the cold head 241 and the cooling medium, and the cooling medium may cool the main magnet 230. Additionally or alternatively, the cryostat 220 may include a heat conduction member (e.g., or referred to as a heat conduction pole) 242 that is arranged between the main magnet 230 and the cold head 241. The refrigeration component 240 may cool the heat conduction member 242 by heat exchange between the cold head 241 and the heat conduction member 242, and the heat conduction member 242 may cool the main magnet 230.

In some embodiments, the main magnet 230 may include a plurality of main coils 231 (e.g., A, B, C, D, E as illustrated in FIG. 2) and a main skeleton 232 for supporting the plurality of main coils 231. The skeleton 232 may be provided with at least one coil slot for accommodating the plurality of main coils 231. The main skeleton 232 may be a ring-shaped structure coaxial with the cryostat 220. Each of the plurality of main coils 231 may be wound on the main skeleton 232.

The shielding coil assembly 260 may be configured to shield the main magnetic field from leaking to an exterior of the superconducting MR apparatus 200. In some embodiments, the shielding coil assembly 260 may be arranged in the inner container 222. For example, the shielding coil assembly 260 may be arranged in the second cavity formed by the inner container 222. The shielding coil assembly 260 may include a plurality of shielding coils 261 (e.g., F, G) and a shielding skeleton 262 for supporting the plurality of shielding coils 261. The shielding skeleton 262 may be provided with at least one coil slot for accommodating the plurality of shielding coils 261. The shielding skeleton 262 may be a ring-shaped structure coaxially arranged with the cryostat 220. Each of the plurality of shielding coils 261 may be wound on the shielding skeleton 262. The radial dimension of the shielding skeleton 262 may be larger than the radial dimension of the main skeleton 232. As used herein, the radial dimension of a component refers to the dimension of the component along a radial direction of the component. For instance, the radial dimension of a cylindrical component (e.g., the main skeleton 232, the shielding skeleton 262) is the radius or the diameter of a cross-section of the cylindrical component that is perpendicular to the long axis of the cylindrical component (e.g., the Z axis illustrated in FIG. 2). The main skeleton 232, the shielding skeleton 262, and the inner container 222 may be assembled coaxially.

The shimming device 250 may be configured to generate an auxiliary magnetic field to improve uniformity of the main magnetic field generated by the main magnet 230. Conventionally, the shimming device 250 may be arranged in the bore 270 formed by the cryostat 220 (i.e., the shimming device 250 being arranged outside the cryostat 220), which may result in a reduction in the space available in the bore 270 where an object is being placed for imaging. In order to provide enough space in the bore 270 for accommodating the object, the magnet assembly including the main magnet 230 may need to be configured to form a larger bore and therefore farther away from the object than without the shimming device 250 in the bore 270. Accordingly, such an arrangement of placing the shimming device 250 outside the cryostat 220 may cause issues including, e.g., a need for a stronger main magnet 230. In some embodiments of the present disclosure, the shimming device 250 may be arranged between the main magnet 230 and the shielding coil assembly 260 (i.e., the shimming device 250 being arranged in the cryostat 220). Compared with the conventional arrangement of the shimming device 250 as described in which the shimming device 250 is arranged outside the cryostat 220, the arrangement of the shimming device 250 according to some embodiments of the present disclosure may avoid the issues caused by having the shimming device 250 occupy space in the bore of the cryostat 220. In some embodiments, the shimming device 250 may be arranged at any position between the main magnet 230 and the shielding coil assembly 260 in the cryostat 220. For example, the shimming device 250 may be arranged on a side of the main magnet 230 facing the shielding coil assembly 260. As another example, two ends of the shimming device 250 may be respectively fixed on side walls (e.g., the two second connection side walls 2223 of the inner container 222) of the cryostat 220 between the main magnet 230 and the shielding coil assembly 260. In some embodiments, the cryostat 220, the gradient coil assembly 210, the main magnet 230, the shimming device 250, and the shielding coil assembly 260 may be assembled coaxially.

The shimming device 250 may include at least one supporting component and wires arranged on the at least one supporting component. In some embodiments, the at least one supporting component and the main magnet 230 may be assembled coaxially. In some embodiments, a supporting component may have the shape of a hollow cylinder. For example, the supporting component may have a shape of a hollow cylinder. In some embodiments, the supporting component may have another shape. For example, the supporting component may include at least two separate parts wrapping around the main magnet 230 on the side of the main magnet facing the shielding coil assembly 260. In some embodiments, each of the at least two separate parts may be a portion of a hollow cylinder. For example, each of the at least two separate parts may have a half hollow cylinder. In some embodiments, the at least one supporting component may be arranged between the main skeleton 232 and the shielding skeleton 262. In some embodiments, the supporting component may be sleeved outside the main magnet 230. For example, the supporting component may be arranged on an outer circumference of the main magnet. As another example, the supporting component may be arranged on an outer circumference of the main skeleton 232.

In some embodiments, the wires arranged (or wound) on the at least one supporting component may include copper wires, aluminum wires, superconducting wires, or the like, or any combination thereof. The superconducting wires may be made of niobium, thallium, copper-oxygen superconductor, iron-based superconductor, magnesium boride superconductor, lanthanum, strontium, or the like, or any combination thereof. In some embodiments, distribution densities and types of the wires on different supporting components may be the same or different. Merely by way of example, as shown in FIG. 2, the at least one supporting component may include a first supporting component 2511 and a second supporting component 2512. The first supporting component 2511, the second supporting component 2512, and the main magnet 230 may be assembled coaxially. The radial dimension of the first supporting component 2511 may be larger than the radial dimension of the main magnet 230. The radial dimension of the second supporting component 2512 may be larger than the radial dimension of the first supporting component 2511. First wires 2521 and second wires 2522 may be arranged (or wound) on the first supporting component 2511 and the second supporting component 2512, respectively. In some embodiments, the distribution densities of the wires on different supporting components may relate to distances between the supporting components and the main magnet 230. In some embodiments, the smaller the distance between a supporting component and the main magnet 230, the greater the shimming effect (e.g., improving the uniformity of the main magnetic field) on the main magnet 230 after the wire(s) on the support component is energized. For example, a distribution density of the first wires 2521 on the first supporting component 2511 may be greater than a distribution density of the second wires 2522 on the second supporting component 2512.

In some embodiments, there may be a first gap between the at least one supporting component and the main magnet 230. For example, there may be a first gap between the first supporting component 2511 and the main magnet 230. The first gap may be filled with a cooling medium so that the shimming device 250 does not affect a cooling efficiency of the main magnet 230. In some embodiments, there may be a second gap between two neighboring supporting components. For example, there may be a second gap between the first supporting component 2511 and the second supporting component 2512. The second gap may be filled with a cooling medium to cool the wires. As used herein, a first supporting component and a second supporting component are considered neighboring each other if there is no other supporting component in between. In some embodiments, the cooling medium in the second gap may be the same as the cooling medium in the first gap.

In some embodiments, a supporting component of the shimming device 250 may be configured with a plurality of wire groove groups. Each of the plurality of wire groove groups of the supporting component may include a plurality of wire grooves. The plurality of wire groove groups may be arranged on a side wall of the supporting component far away from the main magnet 230 (or referred to as an outer side wall of the supporting component). As used herein, for a component (e.g., a supporting component) having an inner side wall and an outer side wall, the outer side wall of the component refers to a side wall of the component farther away from an axis of the component than the inner side wall of the component. For example, as shown in FIG. 2, a plurality of first wire grooves may be arranged on the outer side wall of the first supporting component 2511 that is farther away from the longitudinal axis z of the first supporting component 2511 and also farther away from the main magnet 230 than the inner side wall of the first supporting component 2511; a plurality of second wire grooves may be arranged on the outer side wall of the second supporting component 2512 that is farther away from the longitudinal axis z of the second supporting component 2512 and also farther away from the first supporting component 2511 than the inner side wall of the second supporting component 2512. The first wires 2521 may be arranged (or wound) in the plurality of first wire grooves. The second wires 2522 may be arranged (or wound) in the plurality of second wire grooves. The plurality of first wire grooves may be spaced apart from the plurality of second wire grooves by the second supporting component 2512 which may reduce the interference between the first wires 2521 arranged in the plurality of first wire grooves and the second wires 2522 arranged in the plurality of second wire grooves. In some embodiments, a wire may be wrapped by an electrically insulating material. Exemplary electrically insulating materials may include an electrically insulating paint, an electrically insulating glue, an electrically insulating paper, an electrically insulating fiber, a plastic, a rubber, or the like, or any combination thereof.

In some embodiments, the shimming device 250 may include one supporting component, and at least one side wall of the supporting component is provided with wire grooves, which may reduce the count of the at least one supporting component (to only one supporting component in these embodiments) and simplify the installation of the MR apparatus 200. For example, the outer side wall of the supporting component may be provided with a plurality of wire grooves. As another example, the outer side wall of the supporting component may be provided with a plurality of first wire grooves and the inner side wall of the supporting component that faces the main magnet 230 may be provided with a plurality of second wire grooves. More descriptions regarding the shimming device 250 may be found elsewhere in the present disclosure (e.g., FIGS. 3A and 3B and the descriptions thereof).

It should be noted that the superconducting MR apparatus 200 and the shimming device 250 illustrated in FIG. 2 are merely provided for the purposes of illustration, and not intended to limit the scope of the present disclosure. For persons having ordinary skills in the art, multiple variations and modifications may be made under the teachings of the present disclosure. In some embodiments, the shimming device 250 including the at least one supporting component and the wires arranged (or wound) in the wire grooves of the plurality of wire groove groups of the at least one supporting component may be suitable for an MR apparatus (e.g., the MR apparatus 100) with a permanent magnet as the main magnet 230. In some embodiments, the count of the at least one supporting component in the shimming device 250 may be three or more. However, those variations and modifications do not depart from the scope of the present disclosure.

Figure 3A:
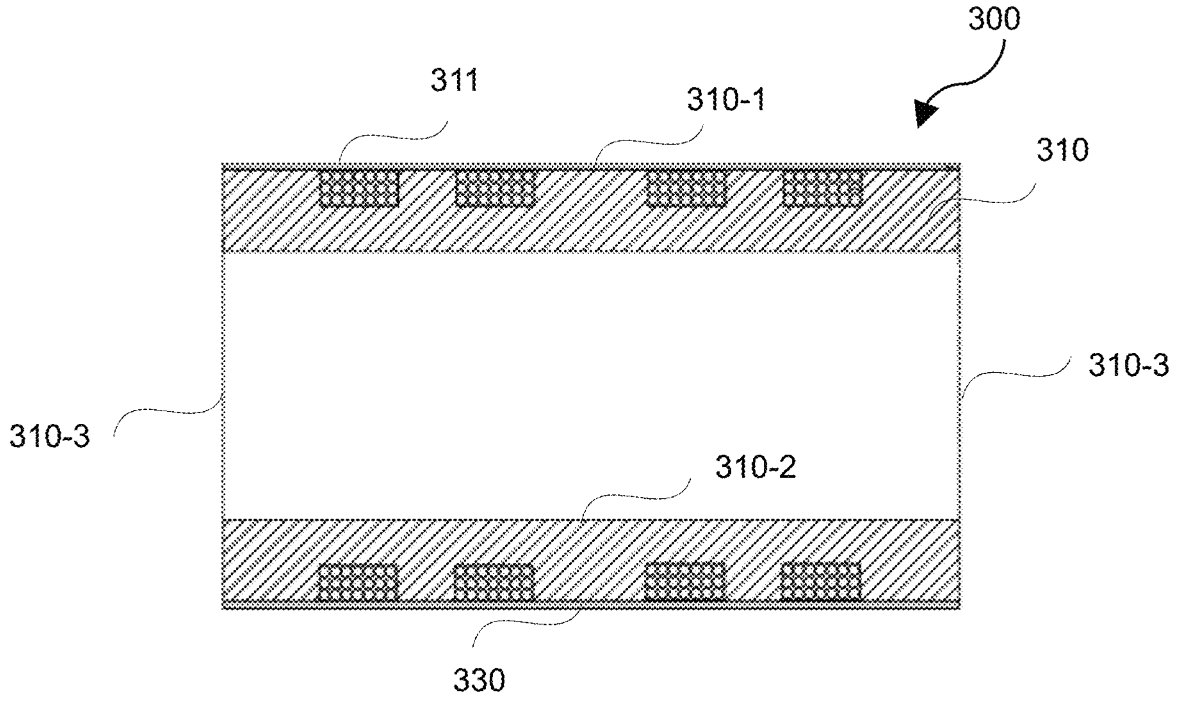
FIG. 3A is a schematic diagram illustrating a cross-sectional view of a shimming device according to some embodiments of the present disclosure.

FIG. 3A is a schematic diagram illustrating a cross-sectional view of a shimming device 300 according to some embodiments of the present disclosure. For illustration purposes, the shimming device 300 with one supporting component is described as an example. It should be noted that this is not intended to be limiting, and the shimming device 300 may include two or more supporting components.

As shown in FIG. 3A, the shimming device 300 may include a supporting component 310 and wires 311. The wires 311 may be arranged (or wound) on the supporting component 310. The supporting component 310 may be configured to support the wires 311. In some embodiments, the supporting component 310 may be a hollow structure, such as a hollow cylinder. The hollow part of the supporting component 310 may partially overlap the bore (e.g., the bore 270) of a cryostat (e.g., the cryostat 220). As shown in FIG. 3A, the supporting component 310 may include an outer side wall 310-1, an inner side wall 310-2, and two connection side walls 310-3 connecting the outer side wall 310-1 and the inner side wall 310-2. A connection side wall 310-3 may be a ring-shaped structure. In some embodiments, as shown in FIG. 3A, a plurality of wire grooves may be arranged on the supporting component 310. For example, the plurality of wire grooves may be arranged on the outer side wall 310-1 of the supporting component 310. The wires 311 may be arranged (or wound) in the plurality of wire grooves. When the wires 311 are energized, an auxiliary magnetic field may be generated. The auxiliary magnetic field and a main magnetic field generated by the main magnet 230 may be superimposed to generate a uniform magnetic field.

In some embodiments, the supporting component 310 may be made of a non-magnetic or weakly magnetic material. A non-magnetic material may refer to a material that is not ferromagnetic and cannot be magnetized. A weakly magnetic material may refer to a material with a magnetic permeability less than a threshold. The threshold may be set empirically or according to an actual need. For example, a steel with a magnetic permeability less than $1.319\times10^{-6}$ h/m (or referred to as a non-magnetic steel) may be considered a weakly magnetic material according to some embodiments of the present disclosure. Exemplary non-magnetic or weakly magnetic materials may include stainless steel, an aluminum alloy, copper, epoxy resin, or the like, or any combination thereof. In some embodiments, the supporting component 310 may be processed by an operation such as casting, coiling, etc.

Figure 3B:
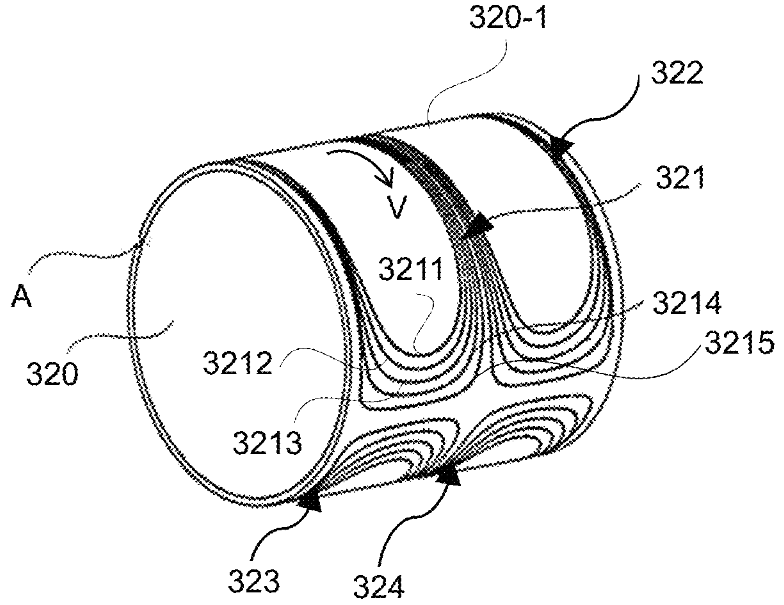
FIG. 3B is a schematic diagram illustrating a supporting component according to some embodiments of the present disclosure.

FIG. 3B is a schematic diagram illustrating a supporting component 320 according to some embodiments of the present disclosure. The supporting component 320 exemplifies a supporting component of the shimming device 300. In some embodiments, as shown in FIG. 3B, the supporting component 320 may be configured with a plurality of wire groove groups (e.g., 321, 322, 323, 324). For example, the plurality of wire groove groups (e.g., 321, 322, 323, 324) may be arranged on an outer side wall 320-1 of the supporting component 320. Each of the plurality of wire groove groups (e.g., 321, 322, 323, 324) may include a plurality of wire grooves. For example, as shown in FIG. 3B, each of the wire groove groups 321, 322, 323, and 324 may include five wire grooves. As another example, the wire groove group 321 may include the wire grooves 3211, 3212, 3213, 3214, and 3215.

In a conventional manufacturing process of a shimming device, the wires are fixed on the surface of a supporting component and therefore easy to separate from the supporting component, which may make it complicated to assemble the shimming device and other components (e.g., the main magnet 230). In some embodiments of the present disclosure, wires may be arranged (or wound) in the plurality of wire grooves (e.g., 3211, 3212, 3213, 3214, 3215) of the plurality of wire groove groups (e.g., 321, 322, 323, 324) configured on the supporting component 320, which may prevent the wires from being separated from the supporting component 320 and prevent the wires from expanding outside the supporting component 320.

In some embodiments, the plurality of wire groove groups (e.g., 321, 322, 323, 324) may include at least one first wire groove group (e.g., 321, 322) and at least one second wire groove group (e.g., 323, 324). The at least one first wire groove group and the at least one second wire groove group may be symmetrically or approximately symmetrically arranged on the supporting component 320 with respect to an axial direction of the supporting component 320 (i.e., an axial direction of the main magnet 230). In some embodiments, the term "approximately" may indicate a relatively low degree (e.g., 1%) of variation in the value or state it describes. For example, the approximate symmetry between the at least one first wire groove group and the at least one second wire groove group may be understood as a degree of symmetry between the at least one first wire groove group and the at least one second wire groove group can exceed a certain threshold (e.g., 90%). As shown in FIG. 3B, the wire groove group 321 and the wire groove group 322 may be arranged side by side along the axial direction of supporting component 320, the wire groove group 323 and the wire groove group 324 may be arranged side by side along the axial direction of supporting component 320. The wire groove group 321 and the wire groove group 323 may be symmetric or approximately symmetric with respect to the axial direction of supporting component 320. The wire groove group 322 and the wire groove group 324 may be symmetric or approximately symmetric with respect to the axial direction of supporting component 320.

In some embodiments, a wire groove group on the supporting component 320 may be of a saddle shape, a spiral shape, a ring shape, etc. The shape of the wire groove group refers to a 3D configuration of the wire groove group when the wire groove group is arranged on the supporting component 320. For example, as shown in FIG. 3B, the wire groove groups 321, 322, 323, and 324 may be of a saddle shape. In some embodiments, a wire groove may be of a closed shape. After the wire is arranged in the wire groove with the closed shape, the wire may form a coil. In such case, the shimming device may include a plurality of coils arranged in the plurality of wire grooves. The shape of each of the plurality of coils may be the same as the wire groove that is used to arrange the coil. For example, when the wire groove is of a saddle shape, the coil arranged in the wire groove may be of the saddle shape. In some embodiments, the closed shapes formed by the plurality of wire grooves (e.g., 3211, 3212, 3213, 3214, 3215) of a groove group (e.g., 321) may be nested. In some embodiments, a distance between neighboring wire grooves may be greater than or equal to a distance threshold to avoid interference between wires laid in neighboring wire grooves. The distance threshold may be set by, e.g., a user (e.g., an engineer) empirically or according to an actual need.

In some embodiments, a wire groove may be symmetrical to enhance the uniformity of the wires arranged in the wire groove. Merely by way of example, the shape of a cross-section of a wire groove perpendicular to an extending direction V of the wire groove may include a square (e.g., a square with rounded corners), a rectangle (e.g., a rectangle with rounded corners), an arc (e.g., a semicircle, a semi-ellipse), a symmetrical polygon formed by multiple straight lines, a symmetrical shape formed by multiple curves, a symmetrical shape formed by multiple straight lines and curves, a dovetail, or the like.

In some embodiments, the shimming device 300 may include a first fixing component (e.g., a first fixing component 330 shown in FIG. 3A). The first fixing component may be configured to fix wires in a plurality of wire grooves of a supporting component (e.g., the supporting component 310, the supporting component 320), which may prevent the wires from detaching from the wire grooves. The first fixing component may be arranged on an outer side wall (e.g., the outer side wall 310-1, the outer side wall 320-1) of the supporting component. In some embodiments, the first fixing component may include a hollow structure (e.g., a hollow cylinder structure), a belt-shaped structure, a strip-shaped structure, or the like, or any combination thereof. In some embodiments, the first fixing component may include one or more fixing parts. The one or more fixing parts may be arranged on the outer side wall of the supporting component at intervals. For example, the first fixing component may include one or more fixing belts/strips. Each of the one or more fixing belts/strips may correspond to at least one wire groove on the supporting component. The one or more fixing belts/strips may be arranged at positions on the outer side wall of the supporting component that correspond to one or more wire grooves. In some embodiments, the first fixing component may be made of at least one material including, e.g., epoxy resin, an adhesive tape, etc.

In some embodiments, two neighboring wire grooves in a wire groove group may be connected. As used herein, two wire grooves are considered neighboring each other if there is no other wire groove in between. In some embodiments, a wire groove may include an outlet. An outlet of one wire groove of two neighboring wire grooves in the wire groove group may be connected with an end of the other wire groove of the two neighboring wire grooves in the wire groove group. The outlet of a wire groove may be configured to allow a wire arranged in the wire groove to extend outside the shimming device 300 or extend to another wire groove (e.g., a neighboring wire groove) of a same wire groove group. For example, as shown in FIG. 3B, the outlet A may be an outlet of the wire groove 3215. The outlet A may be configured to allow the wire arranged in the wire groove 3215 to extend to outside the shimming device 300. In some embodiments, the dimension of the outlet of a wire groove may be larger than or equal to a radial size of the wire in the wire groove so that a wire can go through the outlet. In some embodiments, a depth of the outlet of a wire groove may be larger than or equal to a diameter of the wire in the wire groove, which may reduce the chances that the wire protrude from a surface of the supporting component (e.g., the supporting component 310, the supporting component 320).

Figure 4:
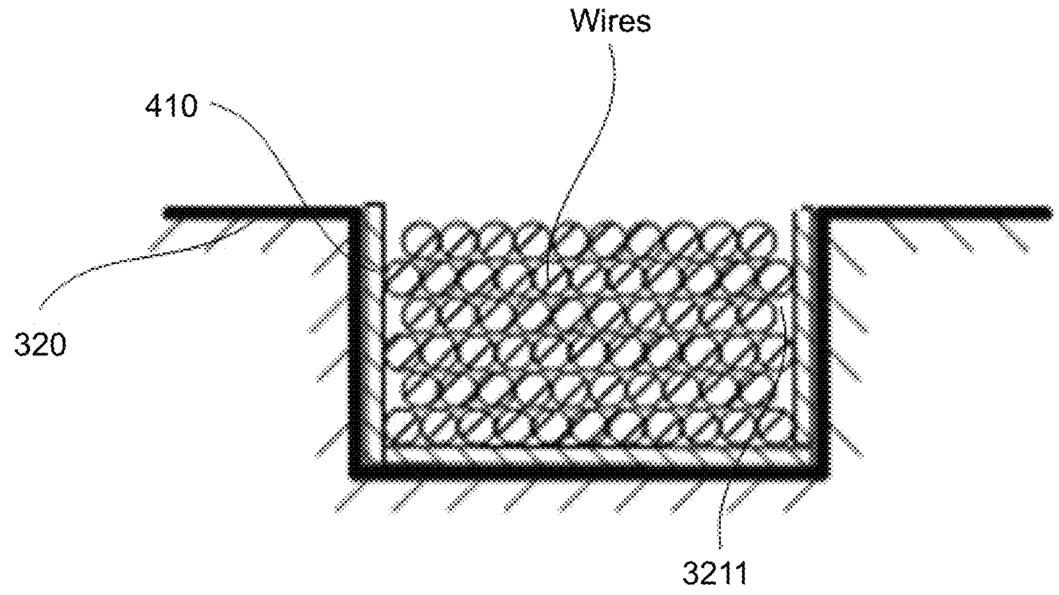
FIG. 4 is a schematic diagram illustrating a cross-sectional view of a wire groove according to some embodiments of the present disclosure.

In some embodiments, a wire groove may include an electrically insulating element (e.g., an electrically insulating layer or coating) that may prevent a wire arranged in the wire groove from directly contacting a supporting component (e.g., the supporting component 310, the supporting component 320). The electrically insulating element may be arranged on the inner wall of the wire groove. As used herein, the inner wall of a wire groove refers to a recessed surface of the wire groove. The electrically insulating element may be arranged on the inner wall of each wire groove on the supporting component. For example, FIG. 4 is a schematic diagram illustrating a cross-sectional view of the wire groove 3211 in FIG. 3B according to some embodiments of the present disclosure. As shown in FIG. 4, the electrically insulating element 410 may be arranged on at least a portion of the inner wall of the wire groove 3211 of the supporting component 320.

In some embodiments, the electrically insulating element may be fixed to or coated on the inner wall of each wire groove on the supporting component by a physical connection, such as gluing, screwing, etc. In some embodiments, the electrically insulating element may be made of or include an electrically insulating material. Exemplary electrically insulating materials may include an electrically insulating paint, an electrically insulating glue, an electrically insulating paper, an electrically insulating fiber, a plastic, a rubber, or the like, or any combination thereof.

Figure 5:
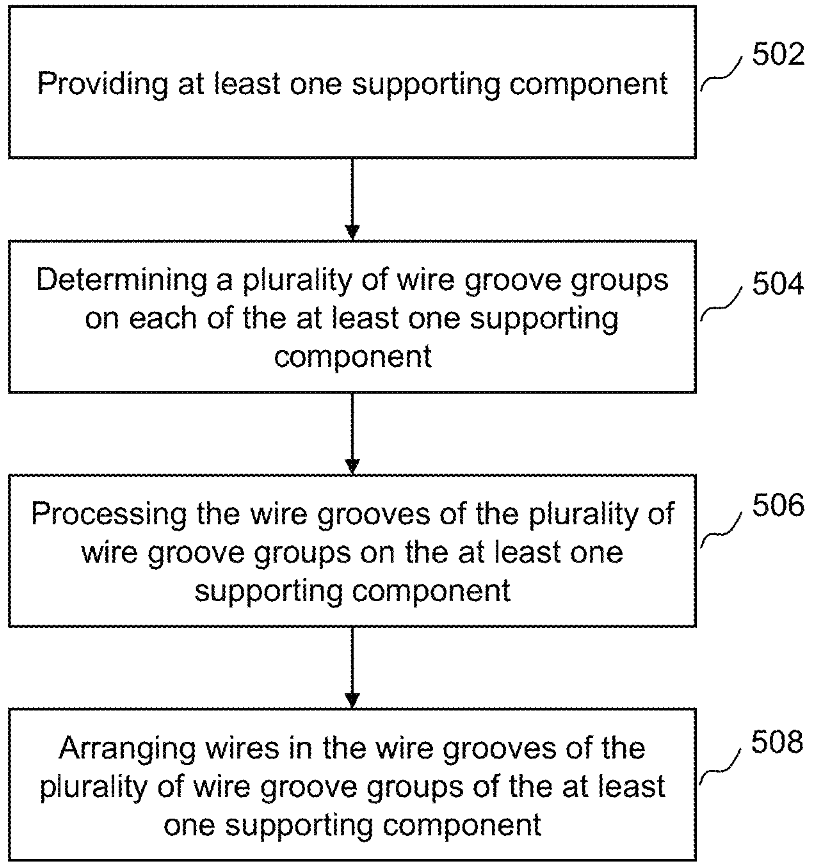
FIG. 5 is a flowchart illustrating an exemplary process for manufacturing a shimming device according to some embodiments of the present disclosure.

FIG. 5 is a flowchart illustrating an exemplary process for manufacturing a shimming device according to some embodiments of the present disclosure.

In 502, at least one supporting component may be provided. More descriptions regarding the supporting component may be found elsewhere in the present disclosure. See, e.g., FIG. 2 and FIGS. 3A-3B, and relevant descriptions thereof.

In 504, a plurality of wire groove groups on each of the at least one supporting component may be determined. In some embodiments, operation 504 may be executed by the MRI system 100 (e.g., the processing device 140). For example, operation 504 may be implemented as a set of instructions (e.g., an application) stored in a storage device (e.g., the storage device 130). The processing device 140 may execute the set of instructions and accordingly be directed to perform operations 504.

In some embodiments, the processing device 140 may obtain a main magnetic field that a main magnet of an MR apparatus (e.g., the MR apparatus 110, the superconducting MR apparatus 200) is configured to generate in an imaging area. Further, for each of the plurality of wire groove groups on each of the at least one supporting component, the processing device 140 may determine a distribution of a plurality of wire grooves of the wire groove group on the supporting component based on the main magnetic field, which may facilitate the generation of a uniform main magnetic field during an imaging operation by the MR apparatus, and in turn improve the performance of the MR apparatus and/or quality of an image generated based on the imaging operation.

In some embodiments, the main magnetic field may be described according to a harmonic function. For example, the main magnetic field may be described according to Equation (1) as below:

$$B_z(x, y, z) = A_0^0 + A_1^1x + B_1^1y + A_1^0z + A_2^0\left(z^2 - \frac{x^2+y^2}{2}\right) + \left[3A_2^1xz + 3B_2^1yz + 6B_2^2xy + 6A_2^2\left(\frac{x^2-y^2}{2}\right)\right] + \ldots, \quad (1)$$

where $B_z(x, y, z)$ denotes the main magnetic field, $$A_0^0$$

denotes a zero-order term of the main magnetic field, $$A_1^1x,\ B_1^1y, \text{ and } A_1^0z$$

denote first-order terms of the main magnetic field, and $$A_2^0\left(z^2 - \frac{x^2+y^2}{2}\right),$$

$$[3A_2^1xz],\ [3B_2^1yz],\ [6B_2^2xy],$$

and $$\left[6A_2^2\left(\frac{x^2-y^2}{2}\right)\right]$$

and denote second-order terms of the main magnetic field.

In some embodiments, the terms describing the main magnetic field may be determined by using Equation (1) to fit an actual main magnetic field. Further, the shimming device may be designed based on the determined terms of the main magnetic field. Except for the zero-order term of the main magnetic field, other terms of the main magnetic field may affect the uniformity of the main magnetic field. Therefore, the component(s) of the main magnetic field described in the other term(s) of the main magnetic field may be eliminated or reduced using a shimming device to improve the uniformity of the main magnetic field. For example, according to the fitting results, other terms except for the zero-order term $$A_0^0$$

and the first-order terms $$A_1^1x$$

may be negligible, the shimming device may be determined based on the first-order terms $$A_1^1x.$$

A term with a higher order of the main magnetic field may have a smaller influence on the uniformity of the main magnetic field but correspond to a higher manufacturing cost of a shimming device configured to eliminate or reduce such an influence on the main magnetic field due to, e.g., the needs for a higher distribution density of wires on the supporting component(s) of the shimming device. Therefore, terms of the main magnetic field whose influences on the uniformity of the main magnetic field are to be eliminated or reduced may be determined according to the magnitude of the influence on the uniformity of the main magnetic field and the manufacturing costs of the shimming device. In some embodiments, shapes of wire groove groups of the shimming device may be determined based on the terms of the main magnetic field that need to be eliminated or reduced. For example, when one or more of the first-order term $$A_1^0z$$

and the second-order term $$A_2^0\left(z^2 - \frac{x^2+y^2}{2}\right)$$

need to be eliminated or reduced, the shimming device may include a plurality of wire groove groups of the spiral shape. As another example, when one or more of the first-order terms $$A_1^1x \text{ and } B_1^1y,$$

and the second-order terms $$[3A_2^1xz],\ [3B_2^1yz],\ [6B_2^2xy],$$

and $$\left[6A_2^2\left(\frac{x^2-y^2}{2}\right)\right]$$

need to be eliminated or reduced, the shimming device may include a plurality of wire groove groups of the saddle shape. As a further example, when one of the first-order term $$A_1^0 z$$

and the second-order term $$A_2^0\left(z^2-\frac{x^2+y^2}{2}\right)$$

and one of the first-order terms $$A_1^1 x \text{ and } B_1^1 y,$$

and the second-order terms $$\left[3A_2^1 xz\right], \left[3B_2^1 yz\right], \left[6B_2^2 xy\right],$$

and $$\left[6A_2^2\left(\frac{x^2-y^2}{2}\right)\right]$$

need to De eliminated or reduced, the shimming device may include one wire groove group of the saddle shape and one wire groove group of the spiral shape.

In some embodiments, the count of wire groove groups of the shimming device may be determined based on the component(s) of the main magnetic field that need(s) to be eliminated or reduced. In some embodiments, such component(s) of the main magnetic field to be eliminated or reduced may correspond to the term(s) of the main magnetic field except for the zero and first order terms. A term of a higher order of the main magnetic field may be eliminated or reduced using a shimming device with more wire groove groups. For example, the shimming device used to eliminate or reduce one or more of the second-order terms $$\left[3A_2^1 xz\right], \left[3B_2^1 yz\right], \left[6B_2^2 xy\right],$$

and $$\left[6A_2^2\left(\frac{x^2-y^2}{2}\right)\right]$$

may need more wire groove groups than the shimming device used to eliminate or reduce one or more of the first-order terms $$A_1^1 x \text{ and } B_1^1 y.$$

In some embodiments, a wire groove group corresponding to a term of a low order may be arranged closer to the main magnet than a wire groove group corresponding to a term of a high order. For example, as described in connection with FIG. 2, the shimming device 250 may include a first supporting component 2511 and a second supporting component 2512. The wire groove groups on the first supporting component 2511 may correspond to one or more of the first-order terms $$A_1^1 x \text{ and } B_1^1 y,$$

while the wire groove groups on the second supporting component 2512 may correspond to one or more of the second-order terms $$\left[3A_2^1 xz\right], \left[3B_2^1 yz\right], \left[6B_2^2 xy\right],$$

and $$\left[6A_2^2\left(\frac{x^2-y^2}{2}\right)\right].$$

In some embodiments, a plurality of wire groove groups corresponding to different terms of the main magnetic field may be arranged on a same supporting component or different supporting components. For example, a plurality of wire groove groups corresponding to the first-order term $$A_1^1 x$$

may arrange on the first supporting component 2511 and a plurality of wire groove groups corresponding to the second-order term $$\left[3A_2^1 xz\right]$$

may be arranged on the second supporting component 2512. As another example, a plurality of wire groove groups corresponding to the first-order term $$A_1^1 x$$

and a plurality of wire groove groups corresponding to the second-order term $$[3A_2^1 xz]$$

may be arranged on the first supporting component 2511, for example, on inner side wall and outer side wall of the first supporting component 2511, respectively.

Figure 6:
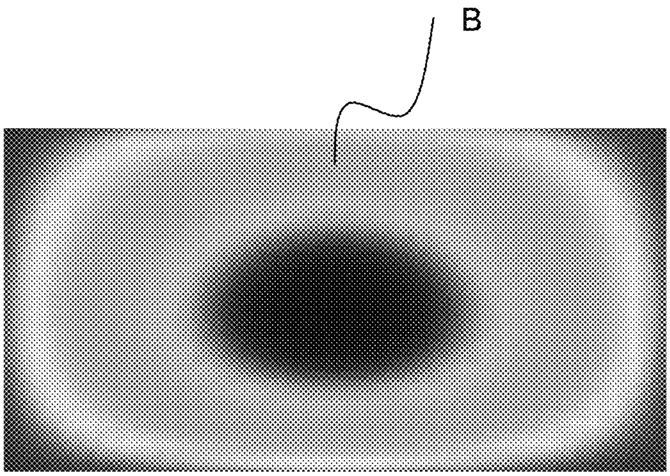
FIG. 6 is a plane diagram illustrating a distribution of a current density according to some embodiments of the present disclosure.

In some embodiments, for each of the at least one supporting component, the processing device 140 may determine a distribution of a current density on the supporting component based on the main magnetic field. Then, the processing device 140 may determine a distribution of a plurality of wire grooves of a wire groove group on the supporting component based on the distribution of the current density. Merely by way of example, the processing device 140 may determine whether a current density on an area of the supporting component is greater than or equal to a threshold. The threshold may be set by, e.g., a user (e.g., an engineer) empirically or according to an actual need. If the current density on the area of the supporting component is greater than or equal to the threshold, the processing device 140 may determine the area as an area where wire grooves of the wire groove group are arranged. For example, FIG. 6 is a plane diagram illustrating a distribution of a current density according to some embodiments of the present disclosure. As shown in FIG. 6, a ring-shaped area B has a current density greater than the threshold and accordingly may be determined as the area where the wire grooves of the wire groove group need to be arranged.

Figure 7A:
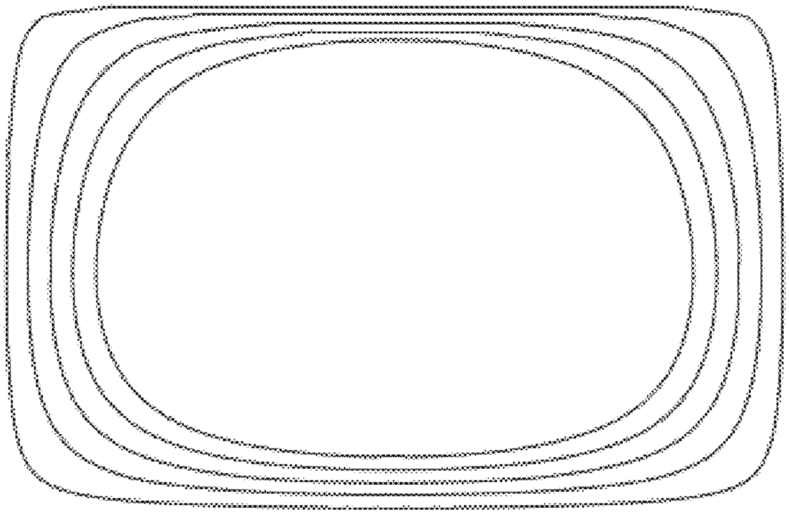
FIG. 7A is a plane diagram illustrating a distribution of wire grooves of a wire groove group according to some embodiments of the present disclosure.
Figure 7B:
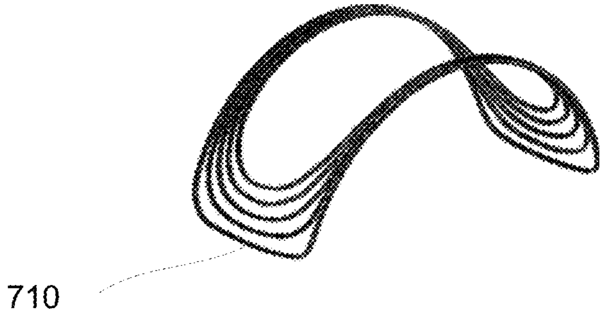
FIG. 7B is a schematic diagram illustrating a 3D configuration of wire grooves of a wire groove group on a supporting component according to some embodiments of the present disclosure.

Further, the processing device 140 may determine the distribution of the plurality of wire grooves of the wire groove group on the supporting component by discretizing the distribution of current density in the area where the current density is greater than or equal to the threshold. For example, FIG. 7A is a plane diagram illustrating a distribution of wire grooves of a wire groove group according to some embodiments of the present disclosure. FIG. 7B is a schematic diagram illustrating a 3D configuration of wire grooves of a wire groove group on a supporting component according to some embodiments of the present disclosure. The distribution of the wire grooves of the wire groove group is shown in FIGS. 7A-7B may be obtained by discretizing the distribution of current density in the area B in FIG. 6. As shown in FIG. 7B, the wire groove group 710 may be of a saddle shape.

In 506, the wire grooves of the plurality of wire groove groups may be processed on the at least one supporting component. In some embodiments, the wire grooves of a wire groove group may be processed on a supporting component based on the distribution of the wire grooves of the wire groove group on the supporting component determined as described in operation 504.

In some embodiments, since a track of each of the wire grooves on the supporting component determined according to the distribution of the current density may be irregular, which is difficult to be processed, the wire groove may be processed by five-axis linkage computer numerical control (CNC) machining on the supporting component. In some embodiments, the distribution of the wire grooves of the plurality of wire groove groups on each of the at least one supporting component may be stored in a storage device (e.g., the storage device 130, an external storage device). A CNC machine tool may retrieve information of the distribution of the wire grooves of the plurality of wire groove groups from the storage device via a network (e.g., the network 120). Additionally or alternatively, information of the distribution of the wire grooves of the plurality of wire groove groups may be input into the CNC machine tool by a user. The CNC machine tool may process the wire grooves on the at least one supporting component based on the information of the distribution of the wire grooves.

In 508, wires may be arranged (or wound) in the wire grooves of the plurality of wire groove groups on the at least one supporting component.

In some embodiments, at least one wire may be arranged (or wound) in the wire grooves of the plurality of wire groove groups on the at least one supporting component. In some embodiments, for at least a portion of wire grooves in a same wire groove group, a wire may be extended through the at least a portion of the wire grooves of the wire groove group. The wire may be extended to an exterior of the shimming device through an outlet of a wire groove of the portion of the wire grooves. In some embodiments, for each of at least a portion of wire grooves of the plurality of wire groove groups, a wire may be placed in the wire groove. The wires in the portion of wire grooves may be connected in series through outlets of the wire grooves to form a series connection. The wires in a series connection may be extended to an exterior of the shimming device through an outlet of a wire groove of the portion of the wire grooves. More descriptions regarding the arrangement of the wires in the wire grooves may be found elsewhere in the present disclosure. See, e.g., FIGS. 8A-8B and relevant descriptions thereof.

In some embodiments, for a specific supporting component, before the wires are arranged in the wire grooves of the plurality of wire groove groups on the supporting component, the wires may be wound based on the distribution of the wire grooves on the supporting component, and then the wound wires may be disposed in the wire grooves on the supporting component so that the wires may be reliably confined in the wire grooves. Further, the wires may be fixed in the wire grooves by a first fixing component to prevent the wires from being detached from the wire grooves.

Compared with a conventional approach for manufacturing a shimming device, during a manufacturing process of the shimming device according to some embodiments of the present disclosure, the plurality of wire groove groups may be directly processed on the supporting component and the wires may be placed in wire grooves of the plurality of wire groove groups, thereby simplifying the manufacturing process of the shimming device, reduces the manufacturing cost of the shimming device, and improves the firmness of the wires on the supporting component.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 8A:
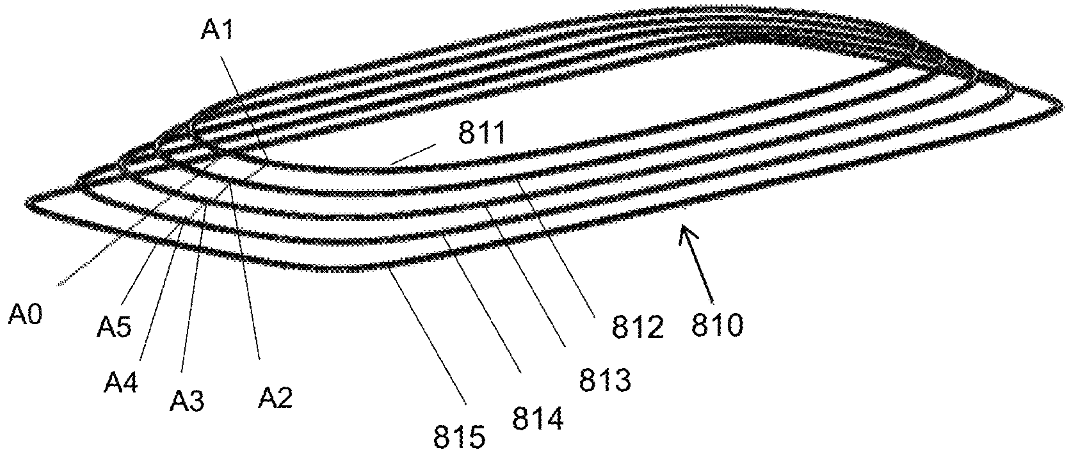
FIG. 8A is a schematic diagram illustrating an arrangement of a wire in wire grooves of a wire groove group according to some embodiments of the present disclosure.

FIG. 8A is a schematic diagram illustrating an arrangement of a wire in wire grooves of a wire groove group according to some embodiments of the present disclosure. As shown in FIG. 8A, the wire groove group 810 may include five wire grooves (e.g, 811, 812, 813, 814, 815). Each of the five wire grooves (e.g., 811, 812, 813, 814, 815) may include an outlet (e.g, A1, A2, A3, A4, A5). The five wire grooves may include a target wire groove and the target wire groove may include an inlet. For example, as shown in FIG. 8A, the target wire groove 811 may include an inlet A0.

A wire may be extended into the target wire groove 811 through the inlet A0 of the target wire groove 811. In some embodiments, the inlet and the outlet of the target wire groove 811 may coincide; the wire may be extended into the target wire groove 811 through the outlet A1 of the target wire groove 811. In the target wire groove 811, the wire may be winded one or more turns, and then the wire may be extended into a wire groove 812 neighboring the target wire groove 811 through an outlet A1 of the target wire groove 811. In the wire groove 812, the wire may be winded the same number of turns, and then the wire may be extended into a wire groove 813 neighboring the wire groove 812 through an outlet A2 of the wire groove 812. In the wire groove 813, the wire may be winded the same number of turns, and then the wire may be extended into a wire groove 814 neighboring the wire groove 813 through an outlet A3 of the wire groove 813. In the wire groove 814, the wire may be winded the same number of turns, and then the wire may be extended into a wire groove 815 neighboring the wire groove 814 through an outlet A4 of the wire groove 814. In the wire groove 815, the wire may be winded the same number of turns, and then the wire may be extended to an exterior of the shimming device through an outlet A5 of the wire groove 815.

It should be noted that the above description regarding the arrangement of the wire in the wire grooves is merely provided for the purposes of illustration, and not intended to limit the scope of the present disclosure. For persons having ordinary skills in the art, multiple variations or modifications may be made under the teachings of the present disclosure. For example, the target wire groove may be other wire grooves (e.g., the wire groove 815) in the five wire grooves. As another example, a count of the turns of the wire that is wound in the five wire grooves may be different. However, those variations and modifications do not depart from the scope of the present disclosure.

Figure 8B:
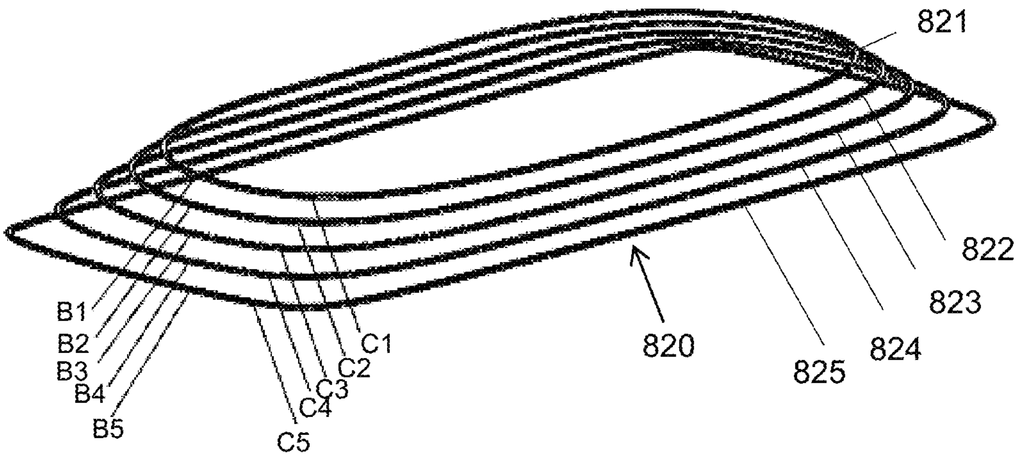
FIG. 8B is a schematic diagram illustrating an arrangement of wires in wire grooves of a wire groove group according to some embodiments of the present disclosure.

FIG. 8B is a schematic diagram illustrating an arrangement of wires in wire grooves of a wire groove group according to some embodiments of the present disclosure. As shown in FIG. 8B, the wire groove group 820 may include five wire grooves (e.g, 821, 822, 823, 824, 825). Each of the five wire grooves (e.g, 821, 822, 823, 824, 825) may include an inlet (e.g, B1, B2, B3, B4, B5) and an outlet (e.g, C1, C2, C3, C4, C5). A wire may be extended into a wire groove 821 through an inlet B1 of the wire groove 821. In the wire groove 821, the wire may be winded one or more turns, and then the wire may be extended to an exterior of the shimming device through an outlet A1 of the wire groove 821. A wire may be extended into a wire groove 822 through an inlet B2 of the wire groove 822. In the wire groove 822, the wire may be winded the same number turns, and then the wire may be extended to an exterior of the shimming device through an outlet A2 of the wire groove 822. A wire may be extended into a wire groove 823 through an inlet B3 of the wire groove 823. In the wire groove 823, the wire may be winded the same number of turns, and then the wire may be extended to an exterior of the shimming device through an outlet A3 of the wire groove 823. A wire may be extended into a wire groove 824 through an inlet B4 of the wire groove 824. In the wire groove 824, the wire may be winded the same number of turns, and then the wire may be extended to an exterior of the shimming device through an outlet A4 of the wire groove 824. A wire may be extended into a wire groove 825 through an inlet B5 of the wire groove 825. In the wire groove 825, the wire may be winded the same number of turns, and then the wire may be extended to an exterior of the shimming device through an outlet A5 of the wire groove 825. In some embodiments, for at least one of the five wire grooves (e.g, 821, 822, 823, 824, 825), the inlet and the outlet of the wire groove may coincide; the wire may be extended into the at least one wire groove through the outlet of the at least one wire groove.

In some embodiments, a portion (e.g., 821, 822, 823) of the five wire grooves in the wire groove group 820 may be arranged (or wound) with a wire and each of the other portion (e.g., 824, 825) of the five wire grooves may be arranged (or wound) a wire. In some embodiments, the wire may include a wire harness made of multiple wires.

It should be noted that the above description regarding the arrangement of the wires in the wire grooves is merely provided for the purposes of illustration, and not intended to limit the scope of the present disclosure. For persons having ordinary skills in the art, multiple variations or modifications may be made under the teachings of the present disclosure. For example, the counts of the turns of at least two of the wires that are wound in the five wire grooves may be different. Merely by way of example, one wire in one wire groove of the five wire grooves may have 3 turns, while another wire in the same or a different wire groove of the five wire grooves may have 4 turns. However, those variations and modifications do not depart from the scope of the present disclosure.

After arranged in the wire grooves of the plurality of wire groove groups on the at least one supporting component, the wire(s) may be energized to generate an auxiliary magnetic field. The auxiliary magnetic field may be superimposed with the main magnetic field generated by the main magnet to improve the uniformity of the main magnetic field. In some embodiments, intensities and directions of currents of one or more wires in a same wire groove group may be the same or different. For example, when one wire traverses all wire grooves of a wire groove group (e.g., the wire being arranged as shown in FIG. 8A), the intensity and direction of the current of the wire in the wire groove group may be the same. In some embodiments, in a wire groove group, the fewer wires, the simpler the conduction control of the shimming device. Therefore, the arrangement of one wire traversing all the wire grooves of the wire groove group may simplify the control and use of the shimming device. As another example, when one wire is disposed in each of wire grooves of a wire groove group (e.g., the wires being arranged as shown in FIG. 8B), the wires in different wire grooves of the wire groove group may be supplied with currents of different intensities and/or directions according to actual needs.

Figure 9:
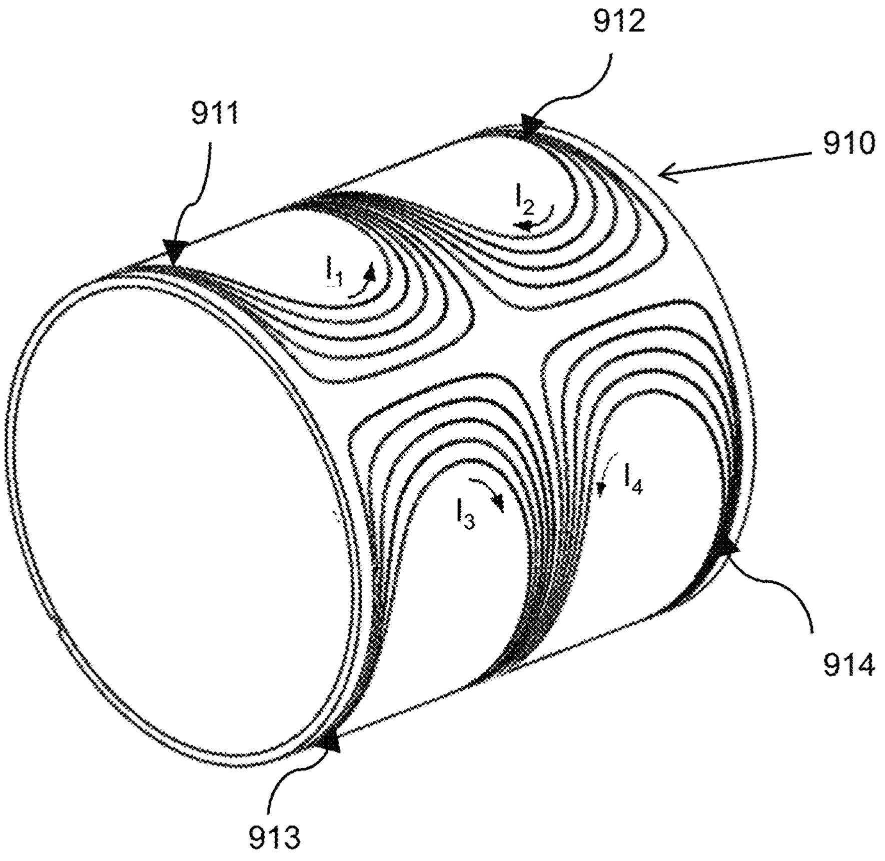
FIG. 9 is a schematic diagram illustrating currents of wires in wire groove groups on a supporting component according to some embodiments of the present disclosure.

FIG. 9 is a schematic diagram illustrating currents of wires in wire groove groups on a supporting component according to some embodiments of the present disclosure. In some embodiments, the intensities and directions of currents of wires in different wire groove groups on a same supporting component may be the same or different. For example, the intensities of currents of the wires in different wire groove groups on the same supporting component may be the same, and the directions of currents of the wires in different wire groove groups on the same supporting component may be different or the same. In some embodiments, the wires in different wire groove groups may be synchronized or independently energized. For example, the wires in different wire groove groups may be connected in series to achieve a simultaneous energization of the wires in different wire groove groups.

Merely by way of example, as shown in FIG. 9, a supporting component 910 is configured with four wire groove groups (e.g., 911, 912, 913, 914). One wire traverses all the wire grooves of a wire groove group (e.g., the wire being arranged as shown in FIG. 8A). The intensity and direction of the current of the wire in the wire groove group may be the same. For example, a current of the wire in wire groove group 911 is denoted as $I_1$, a current of the wire in wire groove group 912 is denoted as $I_2$, a current of the wire in wire groove group 913 is denoted as $I_3$, and a current of the wire in wire groove group 914 is denoted as $I_4$. In some embodiments, the intensities of the currents $I_1$, $I_2$, $I_3$, $I_4$ may be the same or different. For example, the intensities of the currents $I_1$ and $I_2$ may be different, the intensities of the currents $I_1$ and $I_3$ may be the same, and the intensities of the currents $I_2$ and $I_4$ may be the same. In some embodiments, the directions of the currents $I_1$, $I_2$, $I_3$, $I_4$ may be the same or different. For example, as shown in FIG. 9, the directions of the currents $I_1$ and $I_4$ are clockwise and the directions of the currents $I_2$ and $I_3$ are counterclockwise.

It should be noted that the above description regarding the currents of the wires in the wire groove groups is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 10:
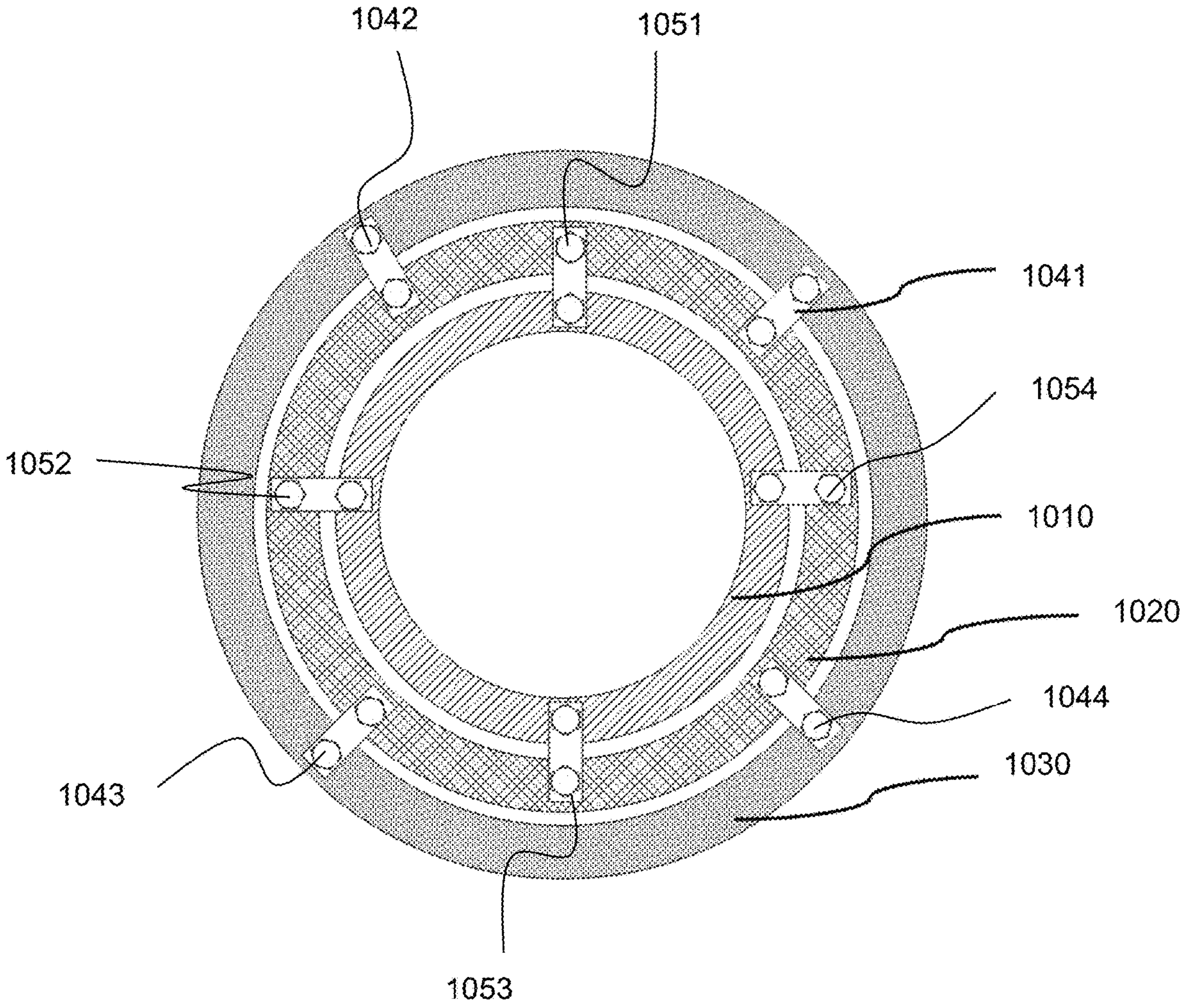
FIG. 10 is a schematic diagram illustrating a shimming device according to some embodiments of the present disclosure.

FIG. 10 is a schematic diagram illustrating a shimming device according to some embodiments of the present disclosure. In some embodiments, after wires are arranged in wire grooves of a plurality of wire groove groups on the at least one supporting component, the at least one supporting component may be assembled to form a shimming device. An exemplary assembly manner may include a key connection, a hook connection, a spline connection, a pin connection, a welding, a bonding, a riveting, a threaded connection, or the like, or any combination thereof. In some embodiments, the shimming device may include a second fixing component. The second fixing component may be configured to fix one of the at least one supporting component on a periphery of another of the at least one supporting component. In some embodiments, the shimming device may be assembled to other components (e.g., a main magnet) of an MR apparatus. An assembly manner between the shimming device and the other components of the MR apparatus may be the same as or different from the assembly manner between the at least one supporting component of the shimming device. For example, the shimming device may include a third fixing component configured to fix one of the at least one supporting component on a periphery of the main magnet.

Merely by way of example, as shown in FIG. 10, the shimming device may include a first supporting component 1020, a second supporting component 1030, and second fixing components 1041, 1042, 1043, 1044. The second fixing components 1041, 1042, 1043, and 1044 may be configured to fix the second supporting component 1030 on a periphery of the first supporting component 1020. Each of the second fixing components 1041, 1042, 1043, and 1044 may be a strip-shaped structure. Two ends of the strip-shaped structure may be extended to and fixed on the first supporting component 1020 and the second supporting component 1030, respectively. In some embodiments, the connection manner between the second fixing components 1041, 1042, 1043, and 1044 and the first supporting component 1020 may be the same as the connection manner between the second fixing components 1041, 1042, 1043, and 1044 and the second supporting component 1030. For example, as shown in FIG. 10, the second fixing components 1041, 1042, 1043, and 1044 and the first supporting component 1020 or the second supporting component 1030 may be connected by a threaded connection. In some embodiments, the connection manner between the second fixing components 1041, 1042, 1043, and 1044 and the first supporting component 1020 may be different from the connection manner between the second fixing components 1041, 1042, 1043, and 1044 and the second supporting component 1030.

Further, as shown in FIG. 10, the shimming device may include third fixing components 1051, 1052, 1053, and 1054. The third fixing components 1051, 1052, 1053, and 1054 may be configured to fix the first supporting component 1020 on a periphery of a main magnet 1010. Each of the third fixing components 1051, 1052, 1053, and 1054 may be a strip-shaped structure. Two ends of the strip-shaped structure may be extended to and fixed on the first supporting component 1020 and the main magnet 1010, respectively. In some embodiments, the connection manner between the third fixing components 1051, 1052, 1053, and 1054 and the first supporting component 1020 may be the same as the connection manner between the third fixing components 1051, 1052, 1053, and 1054 and the main magnet 1010. For example, as shown in FIG. 10, the third fixing components 1051, 1052, 1053, and 1054 and the first supporting component 1020 or the main magnet 1010 may be connected by a threaded connection. In some embodiments, the connection manner between the third fixing components 1051, 1052, 1053, and 1054 and the first supporting component 1020 may be different from the connection manner between the third fixing components 1051, 1052, 1053, and 1054 and the main magnet 1010.

In some embodiments, the second fixing components 1041, 1042, 1043, and 1044 and the third fixing components 1051, 1052, 1053, and 1054 may be the same or different. In some embodiments, the connection manner between the second fixing components 1041, 1042, 1043, and 1044 and other components (e.g., the first supporting component 1020, the second supporting component 1030) may be the same as or different from the connection manner between the third fixing components 1051, 1052, 1053, and 1054 and other components (e.g., the first supporting component 1020, the main magnet 1010).

In some embodiments, the second fixing components and the third fixing components may be other regular shapes (e.g., round, ring) or irregular shapes. In some embodiments, the shapes of the second fixing components and the third fixing components may be different.

It should be noted that the above description regarding the fixed manners of the supporting components is merely provided for the purposes of illustration, and not intended to limit the scope of the present disclosure. For persons having ordinary skills in the art, multiple variations or modifications may be made under the teachings of the present disclosure. For example, the shimming device may include more supporting components, for example, three, four, five, etc. As another example, a count of the second fixing components or the third fixing components may be one. However, those variations and modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A magnetic resonance imaging (MRI) system, comprising:
a cryostat; and
a main magnet arranged in the cryostat and configured to generate a main magnetic field; and
a superconducting shimming device arranged in the cryostat and configured to improve uniformity of the main magnetic field, wherein the superconducting shimming device includes:
at least two supporting components each of which is configured with a plurality of wire groove groups arranged on an outer side wall of the supporting component, wherein each of the plurality of wire grooves is in a closed shape, the closed shapes formed by the plurality of wire grooves are nested, and the at least two supporting components include a first supporting component with a first distance to the main magnet and a second supporting component with a second distance to the main magnet, the first distance being smaller than the second distance;
wires arranged in wire grooves of the plurality of wire groove groups of the at least two supporting components; and
a third fixing component arranged on the outer side wall of one of the at least two supporting components and configured to fix the wires in the wire grooves of the plurality of wire groove groups, and the wires in the wire grooves are fixed between the one of the at least two supporting components and the third fixing component in a direction perpendicular to an axial direction of the main magnet.

2. The MRI system of claim 1, wherein a distribution density of the wires on each of the at least two supporting components is adapted to a distance between the supporting component and the main magnet, with the distribution density varying in accordance with a change of the distance.

3. The MRI system of claim 2, wherein the distribution density of the wires on the first supporting component is greater than the distribution density of the wires on the second supporting component.

4. The MRI system of claim 1, wherein
the main magnet includes a plurality of main coils and a main skeleton for supporting the plurality of main coils, and
one of the first supporting component and the second supporting component, the one closer to the main magnet, is fixed on a periphery of the main skeleton by a fixing component.

5. The MRI system of claim 4, wherein
the first supporting component is fixed on the periphery of the main skeleton by a first fixing component, and
the second supporting component is fixed on a periphery of the first supporting component by a second fixing component.

6. The MRI system of claim 1, wherein each of the wire grooves of the plurality of wire groove groups includes an outlet, the outlet being configured to extend wire arranged in the wire groove to outside the superconducting shimming device or another wire groove of the wire grooves.

7. The MRI system of claim 1, wherein the superconducting shimming device further includes an electrically insulating element that is arranged on an inner wall of the each of the wire grooves.

8. The MRI system of claim 1, wherein the each of the plurality of wire groove groups is in a saddle shape, a spiral shape, or a ring shape.

9. The MRI system of claim 1, wherein each of the wires includes a wire harness of multiple wires.

10. The MRI system of claim 1, wherein the plurality of wire groove groups include at least one first wire groove group and at least one second wire groove group, the at least one first wire groove group and the at least one second wire groove group being arranged symmetrically or approximately symmetrically with respect to the axial direction of the main magnet.

11. The MRI system of claim 1, wherein the superconducting shimming device is manufactured by:
providing the at least two supporting components;
determining the plurality of wire groove groups on each of the at least two supporting components;
processing wire grooves of the plurality of wire groove groups on the at least two supporting components; and
arranging wires in the wire grooves of the plurality of wire groove groups on the at least two supporting components.

12. The MRI system of claim 11, wherein the determining the plurality of wire groove groups on the each of the at least two supporting components includes:
for the each of the plurality of wire groove groups, determining, based on the main magnetic field, a distribution of the wire grooves of the wire groove group on the each of the at least two supporting components.

13. The MRI system of claim 12, wherein the determining, based on the main magnetic field, the distribution of wire grooves of the wire groove group on the each of the at least two supporting components includes:
on the each of the at least two supporting components,
determining a distribution of a current density on the supporting component based on the main magnetic field, and
determining the distribution of the wire grooves on the supporting component based on the distribution of the current density.

14. The MRI system of claim 1, wherein a distribution of wire grooves of each wire groove group on a corresponding supporting component is adapted to a current density distribution on the corresponding supporting component.

15. The MRI system of claim 1, wherein the third fixing component is made of at least one material including epoxy resin or an adhesive tape.

16. A magnetic resonance imaging (MRI) system, comprising:
a cryostat; and
a main magnet arranged in the cryostat and configured to generate a main magnetic field;
a shielding coil assembly arranged in the cryostat and coaxially arranged relative to the main magnet, wherein the main magnet is placed closer to a center of the cryostat than the shielding coil assembly; and
a superconducting shimming device arranged in the cryostat and configured to improve uniformity of the main magnetic field, wherein
the superconducting shimming device is arranged between the main magnet and the shielding coil assembly and closer to the main magnet than the shielding coil assembly, and a gap between the superconducting shimming device and the main magnet is filled with a cooling medium, the superconducting shimming device includes:

at least one supporting component each of which is configured with a plurality of wire groove groups arranged on an outer side wall of the supporting component, wherein a distribution of wire grooves of each wire groove group on a corresponding supporting component is adapted to a current density distribution on the corresponding supporting component;

wires arranged in wire grooves of the plurality of wire groove groups of the at least one supporting component; and a third fixing component arranged on the outer side wall of the supporting component and configured to fix the wires in the wire grooves of the plurality of wire groove groups, and the wires in the wire grooves are fixed between the supporting component and the third fixing component in a direction perpendicular to an axial direction of the main magnet.

17. The MRI system of claim 16, wherein the at least one supporting component includes at least two supporting components, distribution densities of the wires on the at least two supporting components are different and a difference between the distribution densities of the wires on the at least two supporting components relates to distances each of which is between each of the at least two supporting components and the main magnet.

18. The MRI system of claim 16, wherein each of the plurality of wire grooves is in a closed shape, and the closed shapes formed by the plurality of wire grooves are nested.

19. A magnetic resonance imaging (MRI) system, comprising:

a cryostat; and a main magnet arranged in the cryostat and configured to generate a main magnetic field; and a superconducting shimming device arranged in the cryostat and configured to improve uniformity of the main magnetic field, wherein the superconducting shimming device includes:

at least two supporting components each of which is configured with a plurality of wire groove groups arranged on an outer side wall of the supporting component, wherein the at least two supporting components include a first supporting component with a first distance to the main magnet and a second supporting component with a second distance to the main magnet, the first distance being smaller than the second distance; and wires arranged in wire grooves of the plurality of wire groove groups of the at least two supporting components, wherein a distribution density of wires on the first supporting component is greater than a distribution density of wires on the second supporting component.

* * * * *